United States Patent
Tournier et al.

(10) Patent No.: US 8,828,882 B2
(45) Date of Patent: Sep. 9, 2014

(54) METHOD FOR FORMING A DEEP TRENCH IN A MICROELECTRONIC COMPONENT SUBSTRATE

(71) Applicant: STMicroelectronics (Crolles 2) SAS, Crolles Cedex (FR)

(72) Inventors: Arnaud Tournier, Grenoble (FR); François Leverd, Saint Ismier (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 13/713,135

(22) Filed: Dec. 13, 2012

(65) Prior Publication Data

US 2013/0154051 A1    Jun. 20, 2013

(30) Foreign Application Priority Data

Dec. 20, 2011    (FR) ...................... 11 62070

(51) Int. Cl.
*H01L 21/302* (2006.01)
*H01L 21/461* (2006.01)
*H01L 29/06* (2006.01)
*H01L 21/762* (2006.01)
*H01L 21/3065* (2006.01)

(52) U.S. Cl.
CPC ...... *H01L 21/76237* (2013.01); *H01L 29/0649* (2013.01); *H01L 21/30655* (2013.01)
USPC ............ 438/710; 257/E21.147; 257/E21.218; 257/E21.232; 257/E21.546; 438/400; 438/424; 438/427; 438/701; 438/712; 438/735

(58) Field of Classification Search
USPC ............ 257/E21.147, E21.218, E21.232, 257/E21.546; 438/400, 424, 427, 701, 710, 438/712, 735
See application file for complete search history.

(56) References Cited

U.S. PATENT DOCUMENTS

| | | | |
|---|---|---|---|
| 3,920,482 A | 11/1975 | Russell | |
| 5,945,352 A | 8/1999 | Chen et al. | |
| 2003/0211686 A1* | 11/2003 | Panda et al. | 438/243 |
| 2006/0180885 A1 | 8/2006 | Rhodes | |
| 2010/0289107 A1 | 11/2010 | Regolini et al. | |
| 2011/0207323 A1 | 8/2011 | Ditizio | |

FOREIGN PATENT DOCUMENTS

WO    WO-0036631 A1    6/2000

OTHER PUBLICATIONS

Park, Byung Jun et al: "Deep Trench Isolation for Crosstalk Suppression in Active Pixel Sensors with 1.7 μm Pixel Pitch," Japanese Journal of Applied Physics, vol. 46, No. 4B, 2007, pp. 2454-2457.
INPI Search Report and Written Opinion for FR1162070 mailed Aug. 6, 2012 (8 pages).

* cited by examiner

*Primary Examiner* — Asok K Sarkar
(74) *Attorney, Agent, or Firm* — Gardere Wynne Sewell LLP

(57) ABSTRACT

A trench is formed in a semiconductor substrate by depositing an etch mask on the substrate having an opening, etching of the trench through the opening, and doping the walls of the trench. The etching step includes a first phase having an etch power set to etch the substrate under the etch mask, and a second phase having an etch power set smaller than the power of the first phase. Further, the doping of the walls of the trench is applied through the opening of the etch mask.

20 Claims, 4 Drawing Sheets

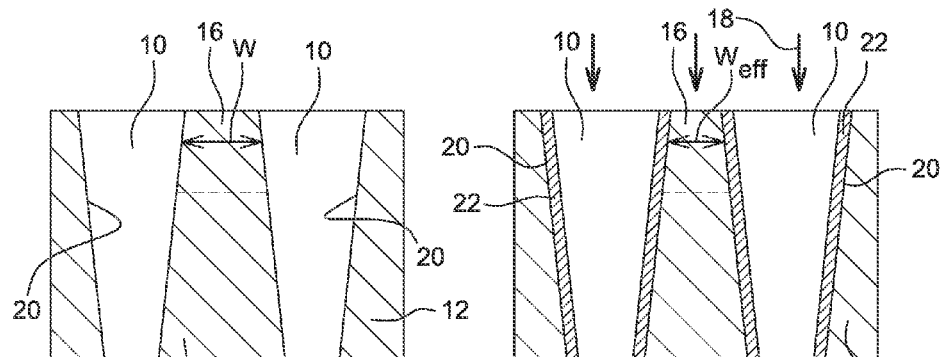
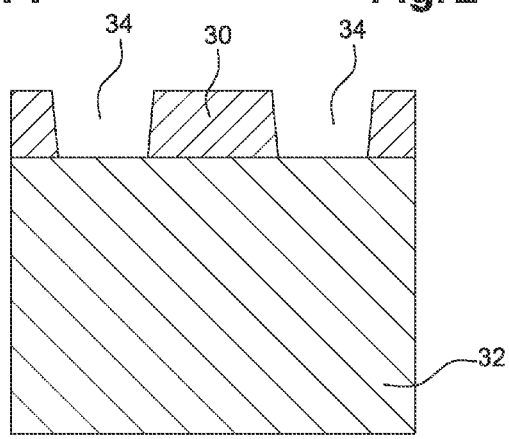

METHOD FOR FORMING A DEEP TRENCH IN A MICROELECTRONIC COMPONENT SUBSTRATE

PRIORITY CLAIM

This application claims priority from French Application for Patent No. 1162070 filed Dec. 20, 2011, the disclosure of which is incorporated by reference.

BACKGROUND

The present disclosure relates to the forming of trenches in microelectronic component substrates.

DISCUSSION OF THE RELATED ART

In microelectronics, trenches are currently used to define a functional element by spatially delimiting it from adjacent elements. For example, additive manufacturing techniques are used to form the various layers of material forming unit detection elements of an array sensor, or of transistors of a memory, for example, after which each of the unit elements is isolated from its neighbors by the forming of trenches around it.

A trench however is a great source of defects, and in the absence of any processing of its walls, a degradation of the component operation can generally be observed, such a degradation being all the stronger as the form factor of the trench, that is, the ratio of its width to its depth, is small.

Indeed, the walls of a trench have many surface defects. For example, when trenches delimit unit detection elements, this results in significant noise in the signal that is delivered and a quantum efficiency loss. This is why the walls of a trench are usually submitted to a processing, and especially to an overdoping, when the trench is formed in a semiconductor substrate, for example, made of silicon.

Referring to FIG. 1, a trench 10 is formed in a substrate 12 to delimit an active element 14, such as, for example, a phototransistor. The properties of element 14 are especially determined by the geometry of an active area 16 located in the upper portion of substrate 12, for example, width W of area 16. The application of an overdoping 18 of walls 20 of trench 10, such as illustrated in FIG. 2, dopes walls 20 across their thickness. Now, the overdoped thickness 22 of walls 20 defines an inactive area which thus decreases the initial bulk of active area 16. Active area 16 thus actually has an effective doped width Weff smaller than initial width W.

To obtain an active area 16 of desired size for an active element 14, the overdoping thickness thus has to be taken into account, which thus decreases the number of active elements that may be formed per surface area unit. Further, the thickness of overdoped trenches is highly random, which makes it difficult to design identical active areas for all active elements. Thus, a strong dispersion of properties can be observed in a set of active elements delimited by overdoped trenches.

There is accordingly a need in the art for a method of manufacturing trenches with overdoped walls enabling to form active areas of larger effective dimension in the upper portion of the substrate.

SUMMARY

In an embodiment, there is provided a method for forming a trench in a semiconductor substrate, comprising the deposition on the substrate of an etch mask having an opening providing access thereto, the ion etching of said trench through said opening, and the doping of the trench walls, wherein: the ion etching comprises: a first phase with an etch power set to etch the substrate under the etch mask; a second phase with an etch power smaller than the power of the first phase; and the doping of the trench walls is applied through the opening of the etch mask.

According to an embodiment, there is provided a method for forming a trench in a semiconductor substrate around an area of a microelectronic element, wherein the geometry of said area defines properties of the microelectronic element, and wherein said area is located in a predetermined thickness of the semiconductor substrate from a surface thereof, comprises the deposition on said surface of the substrate of an etch mask masking said area and having an opening of access to the substrate around said area, the ion etching of said trench through said opening over a thickness of the substrate greater than the thickness of said area, and the doping of the walls of the trench, wherein: the ion etching comprises: a first phase etching the trench over the thickness of said area, with an etch power set to etch the substrate under the etch mask; followed by a second phase etching the trench over the entire thickness thereof, with an etch power smaller than the power of the first phase; and the doping of the walls of the trench is applied through the opening of the etch mask.

In other words, to obtain larger active areas once the doping has been performed, the method starts by decreasing their dimensions by performing an overetching under the mask. The latter then plays the role of an "overhang" which protects the active area during the overdoping step. The overdoped thickness of the active area is then smaller than the overdoped thickness obtained without the overetching. In the end, the effective dimensions of the active area are larger than those obtained without overetching.

According to an embodiment, the ion etching comprises successive elementary cycles each etching a portion of the trench, each cycle comprising: a deposition of a passivation on the internal walls of the trench portion etched during previous cycles; and an anisotropic pulsed plasma ion etching of the trench portion etched during previous cycles; and the thickness of the passivation layers deposited during the first phase is smaller than the thickness of the passivation layers deposited during the second phase.

According to an embodiment, the ion etching comprises successive elementary cycles each etching a portion of the trench, each cycle comprising: a deposition of a passivation layer on the internal walls of the trench portion etched during previous cycles; and an anisotropic pulsed plasma ion etching of the trench portion etched during previous cycles; and the power of the plasma during the first phase is smaller than the power of the plasma during the second phase.

According to an embodiment, the ion etching comprises successive elementary cycles each etching a portion of the trench, each cycle comprising: a deposition of a passivation on the internal walls of the trench portion etched during previous cycles; and an anisotropic pulsed plasma ion etching of the trench portion etched during previous cycles; and the time of application of the plasma ion etching of the elementary cycles of the first phase is shorter than the time of application of the plasma ion etching of the elementary cycles of the second phase.

According to an embodiment, the ion etching comprises successive elementary cycles each etching a portion of the trench, each cycle comprising: a deposition of a passivation layer on the internal walls of the trench portion etched during previous cycles; and an anisotropic pulsed plasma ion etching of the trench portion etched during previous cycles; and the amount of etch gas used during the first phase is greater than the amount of etch gas used during the second phase.

According to an embodiment, the plasma ion etching of the elementary cycles is performed in an atmosphere comprising a passivating species, and comprises at least one first etch sequence followed by a second etch sequence with a power smaller than the power of the first etch sequence.

According to an embodiment, the ion etching is a fluorinated plasma ion etching, and the fluorine proportion during the first phase is greater than the fluorine proportion during the second phase.

According to an embodiment, the ion etching is an ion etching with a plasma based on fluorinated compounds selected from the group comprising $CF_4$, $CH_2F_4$, $C_4F_8$, $C_5F_8$, $C_3F_6$, $SF_6$, $NF_3$.

According to an embodiment, the etch mask is made of nitride.

According to an embodiment, the trench surrounds an active area of a photodetector, especially CMOS.

BRIEF DESCRIPTION OF THE DRAWINGS

The foregoing and other features and advantages of the present invention will be discussed in detail in the following non-limiting description of specific embodiments in connection with the accompanying drawings, where the same reference numerals designate the same or functionally similar elements, wherein:

FIGS. 1 to 2 are simplified cross-section views illustrating an etch method according to the state of the art;

FIGS. 3 to 6 are simplified cross-section views illustrating an etch method according to an embodiment;

DETAILED DESCRIPTION OF THE DRAWINGS

Figure 5:
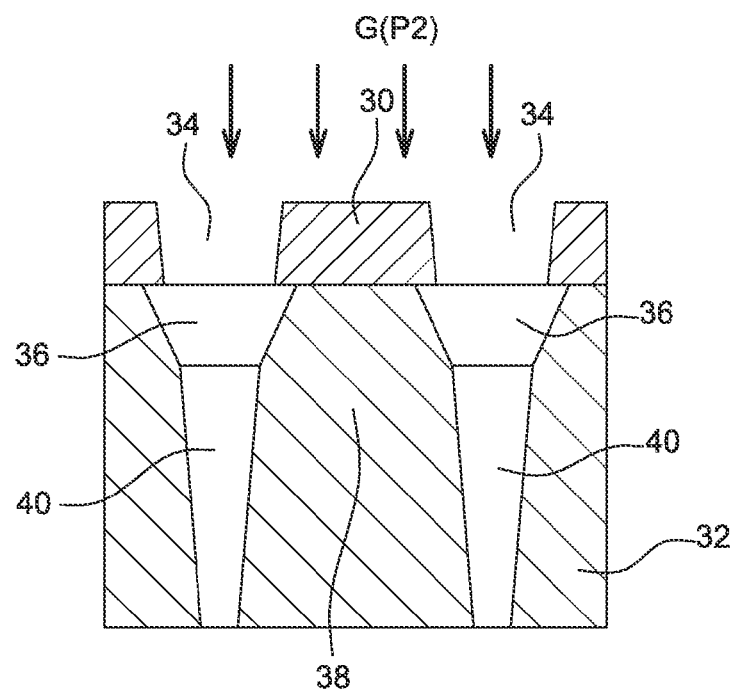
Figure 6:
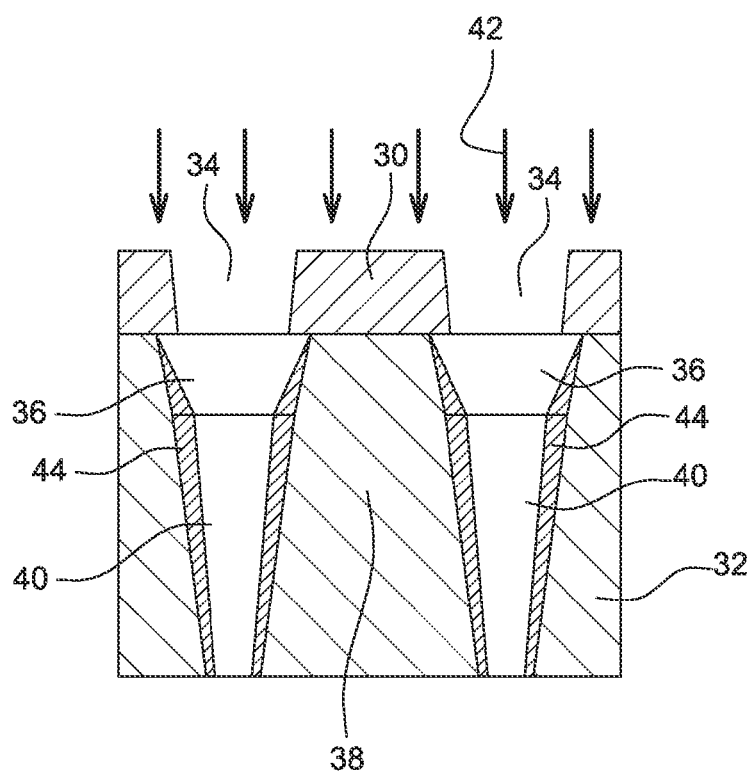

An embodiment will now be described in relation with FIGS. 3 to 5, the different illustrated layers having been deliberately exaggerated for clarity.

The method starts with the forming of an etch mask 30 on a semiconductor substrate 32, for example, made of silicon, comprising an opening 34 of access to substrate 32 (FIG. 3). Etch mask 30 is made of a "hard" material, that is, a material little sensitive to a subsequent etching implemented to form a trench through opening 34. Advantageously, mask 30 is made of nitride while a plasma ion etching is implemented.

The method carries on with the application of a first etching G(P1) through opening 34 of mask 30 (FIG. 4) to etch a first portion of trench 36. The etch power, that is, the substrate volume etched per time unit, is here selected to create an overetching phenomenon. The substrate is then etched under mask 30 according to a first slope, maximum overetching $e_s$ under the substrate being advantageously greater than or equal to 5 nanometers. Mask 30 thus forms an overhang above etch trench portion 36. The first ion etching is advantageously applied to desired height h (i.e., depth) of an active area 38, for example of a photodetector or of a transistor.

The method carries on with the application of a second etching G(P2) through opening 34, to etch a second trench portion 40. The second etching has a lower etch power than the first plasma ion etching G(P1) (FIG. 5) so that there is no or substantially no overetching phenomenon under mask 30. The trench etching especially carries on according to a second etch slope smaller than the first etch slope.

The method then ends with the application of an overdoping 42 of walls 44 of trench 36, 40 through opening 34 of etch mask 30. The latter then forms an overhang which "protects" trench portion 36 from the overdoping. A very small, or even zero, overdoping thickness can then be observed for the trench corresponding to active area 38.

Etch methods which limit the forming of surface defects, such as for example, dry etchings, may be used. This type of method is however very slow and make it difficult to obtain trenches with a very small form factor.

Advantageously, a plasma-based ion etching is used, this type of etching enabling to rapidly etch trenches, and thus being compatible with the mass production of components. More specifically, the plasma ion etching process comprises: etching the trench portion after portion by the successive application of elementary deposition and etch cycles. To avoid the occurrence of very uneven walls with many overhangs and notches which mask wall portions which can uneasily be accessed by an overdoping and, conversely, obtain a trench substantially free of surface defects, and this, even for a trench having a form factor smaller than ¹/₂₅, the elementary etch cycles are themselves carried out in several phases.

Referring to simplified cross-section views 7 to 12, an elementary etch cycle will be described in further detail. The etching comprises a succession of elementary etch cycles, each etching a portion of trench 36, 40 formed in substrate 32.

Figure 7:
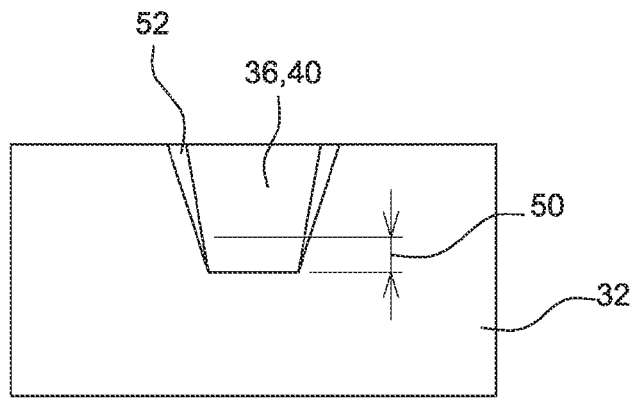
FIGS. 7 to 11 are simplified cross-section views illustrating an elementary etch cycle of an embodiment.

FIG. 7 illustrates the result obtain at the end of previous elementary cycles, the result of last elementary cycle 50 being illustrated between the dotted lines. Especially, trench 36, 40 is covered with a passivation layer 52 of decreasing thickness.

Figure 8:
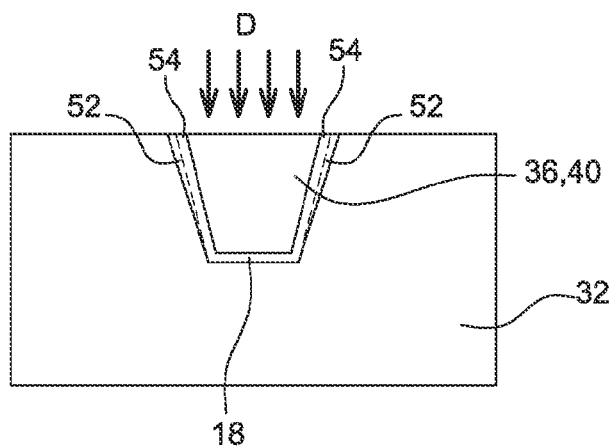

An elementary cycle starts with deposition D of a new passivation layer 54 in the trench. Advantageously, a plasma with only one fluorocarbon gas which deposits a carbon- and fluorine-based polymer on the lateral walls and the bottom of the trench (FIG. 8) is used. The deposited passivation layer 54 is advantageously made of fluorocarbon, and for example originates from gases $C_4F_8$, or $C_5F_8$ or $C_4F_6$. Advantageously, the duration of the deposition is selected to deposit a layer of significant thickness, greater than 10 nanometers, without risking obstructing the trench. The duration for example ranges between 0.7 second and 1 second.

Figure 9:
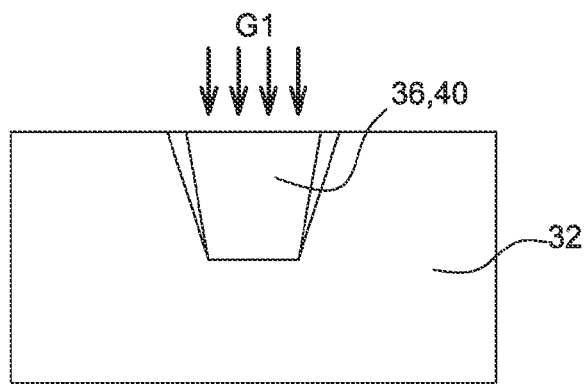

The elementary cycle then continues with the application of a first sequence G1 of anisotropic ion etching based on a pulsed plasma in an atmosphere comprising a passivating species, advantageously a fluorocarbon, especially $C_4F_8$, $C_5F_8$, or $C_4F_6$, and a species used for the etching, advantageously a fluorinated gas, and especially $CF_4$ or $SF_6$. The etch power and application time are selected to etch the bottom of the trench, which comprises passivation layer 54, and thus to access substrate 32 (FIG. 9).

Figure 10:
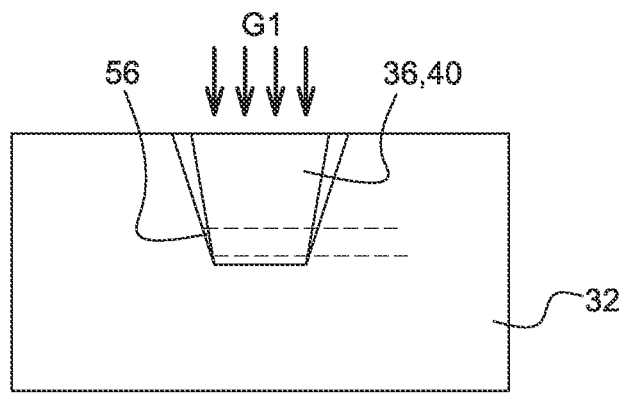

Advantageously, first sequence G1 continues until there remains a few nanometers of passivation layer 54 in the low portion of the trench, which enables to start an additional etching of substrate 32 (FIG. 10). The presence of the passivating species in the plasma further enables, during the same etching, to deposit a passivation film which protects the bottom of the trench from an overetching causing protrusions and overhangs.

Preferably, the deposition conditions of this film are optimized by submitting the trench to a temperature lower than the passivating species condensation temperature, for example, a temperature smaller than or equal to −10° C. for fluorocarbons, and/or by regularly interrupting the etch plasma generation.

Indeed, the plasma is usually generated by submitting an inert gas, such as argon, for example, to electric discharges, which creates ions bombarding the surface to be etched. In particular, the plasma is generated between two electrodes distant by a few centimeters and submitted to an A.C. electric power supply, having a frequency ranging between 100 Hz and 1,000 Hz, for example, 400 Hz, and a power ranging between 100 watts and 1,000 watts, which enables to generate a pulsed plasma and an anisotropic ion etching. The pulse frequency of the plasma ranges between 500 Hz and 2,000 Hz, and is especially equal to 1,000 Hz.

However, during the plasma generation, the passivating species is also ionized. Now, it is more difficult for ions to deposit on the walls of a trench than for non-ionized molecules. By regularly interrupting the plasma generation, non-ionized passivating molecules deposit during such regular interruptions, which eases the film forming. Advantageously, the plasma generation duty cycle, that is, the time percentage during which the plasma is generated, is greater than 50%, and preferably equal to 55%.

The duration of the first sequence is selected to etch substrate 32 to a maximum without risking any overetching phenomenon. For example, the duration of the first sequence ranges between 0.7 second and 1 second.

Figure 11:
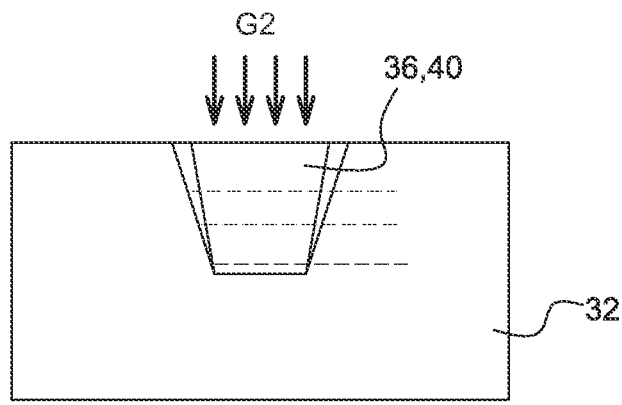

The elementary cycle then continues with a second ion etch sequence G2 which differs from first sequence G1 by a lower power of the plasma. In particular, the power of the plasma of second sequence G2 is smaller than or equal to 80% of the power of the plasma of first sequence G1. By thus decreasing the plasma power, it is more difficult to etch the passivation material deposited on the trench walls, while continuing to etch substrate 32. Indeed, the material on the sides etches slower since it is less bombarded than the bottom of the trench. Any overetching phenomenon with respect to a rectilinear profile of the trench is thus avoided while accurately controlling the profile of trench 36, 40. At the end of second etch sequence G2, a new etched trench portion which is smooth and passivated is thus obtained (FIG. 11).

The power of the second sequence is decreased with respect to that of the first sequence, and the substrate is thus etched slower. Knowing that first sequence G1 also etches substrate 32, but at a higher rate, advantageously, the duration of the second sequence is also selected to optimize the general etch time. In particular, the duration of application of the second sequence ranges between 0.7 second and 1 second.

The previously-described method is implemented in a conventional plasma ion etching enclosure, by modifying the operating parameters of the state of the art. Reference may for example be made to document "*Manufacturing integration considerations of through-silicon via etching*" by Steve Lassig, Journal of Solid State Technology, December 2007 (http://www.electroiq.com/articles/sst/print/volume-50/issue-12/features/cu-low-k/manufacturing-integration-considerations-of-through-silicon-via-etching.html), to document "*Etch Challenges for* 3*-D Integration*" by H. Singh et al., Proceedings of the 3rd Plasma Etch and Strip in Microelectronics Workshop, Grenoble 2010, and to document "*the Yole developpement magazine micronews no* 61", September 2007.

Figure 12:
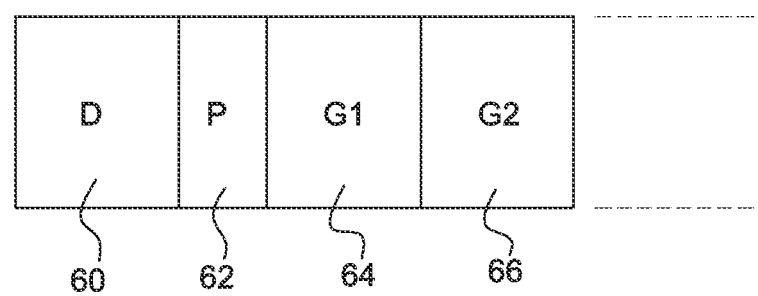
FIG. 12 is a chronogram illustrating an elementary cycle of control of a plasma ion etching enclosure.

The settings corresponding to the previously-described elementary cycle is an elementary control cycle, this cycle being illustrated in FIG. 12 and comprising:

a step of control of the enclosure for the deposition of a passivation layer 54. To achieve this, a fluorocarbon gas plasma alone which will deposit a carbon polymer layer on the patterns is used. The plasma generation circuit of the enclosure is stopped and a passivating species is introduced into the enclosure. A chemical vapor deposition is for example implemented;

a step of control of the enclosure for bleeding the enclosure. The bleeding enables to eliminate the excess passivating gas in the enclosure to promote the etching;

a first step of ion etch control with a fluorinated gas during which the discharge electrodes are controlled for etch sequence G1 based on anisotropic pulsed power plasma. Simultaneously, a passivating species is also introduced into the enclosure;

a second ion etch control step comprising decreasing the power of the plasma to implement the second etch sequence G2.

Advantageously, the elementary cycles thus have at least one of the following features:

the ion etching is a fluorinated plasma etching; the passivation layer is a fluorocarbon layer; the fluorocarbon for example originates from gases $C_4F_8$, $C_5F_8$, or $C_4F_6$;

the power of the second etch sequence is smaller than or equal to 80% of the power of the first etch sequence;

the plasma of the ion etching is generated between two electrodes powered with an A.C. voltage having a power ranging between 100 watts and 1,000 watts, and a frequency ranging between 100 Hz and 1,000 Hz, especially a 400-Hz frequency;

the plasma is pulsed with a duty cycle greater than or equal to 50%, especially a duty cycle equal to 55%;

the pulse frequency of the plasma ranges between 500 Hz and 2,000 Hz, and is especially equal to 1,000 Hz; during the ion etching, the substrate temperature is smaller than the passivating species condensation temperature, especially a temperature smaller than or equal to $-10°$ C. for a fluorinated passivating species;

the duration of the deposition of the passivation layer ranges between 0.7 second and 1 second;

the duration of the first etch sequence ranges between 0.5 second and 1 second; and the duration of the second etch sequence ranges between 0.7 second and 1 second.

To obtain an overetching under etch mask 30 during the first phase of the etching, the settings of the elementary cycles are modified. In particular, the following settings may be applied, alone or combined:

the thickness of the passivation layers deposited per elementary cycle during the first phase is smaller than the thickness of the passivation layers deposited per elementary cycle during the second phase. For example, the time of application or the passivating species concentration is smaller during the first phase;

the power of the plasma during the first phase is smaller than the power of the plasma during the second phase. For example, the power of the plasma of the elementary cycles during the first phase is increased with respect to the power of the plasma of the elementary cycles during the second etch phase;

the time of application of the plasma ion etching of the elementary cycles of the first phase is smaller than the time of application of the plasma ion etching of the elementary cycles of the second phase;

the amount of etch gas used during the first phase is greater than the amount of etch gas used during the second phase. For example, bleeding P is applied for less time to leave more fluorocarbon compounds, or a higher concentration of such compounds is used during the first etch phase.

Different fluorocarbon compounds may also be used for the first and the second etch phase, and in particular a compound having a fluorine content during the first phase greater than the fluorine content of the compound used during the second phase. The fluorinated compounds may thus be selected from the group comprising $CF_4$, $CH_2F_4$, $C_4F_8$, $C_5F_8$, $C_3F_6$, $SF_6$, $NF_3$.

What is claimed is:

1. A method for forming a trench in a semiconductor substrate around an area of a microelectronic element, wherein the geometry of said area defines properties of the microelectronic element, and wherein said area is located in a predetermined thickness of the semiconductor substrate from a surface thereof, said method comprising the deposition on said surface of the substrate of an etch mask masking said area and having an opening of access to the substrate around said area, the ion etching of said trench through said opening over a thickness of the substrate greater than the thickness of said area, and the doping of the walls of the trench, wherein the ion etching comprises:
    a first phase etching the semiconductor substrate to form a first part of the trench over the thickness of said area, with an etch power set to etch the semiconductor substrate under the etch mask;
    followed by a second phase etching the semiconductor substrate to form a second part of the trench over the entire thickness thereof, with an etch power smaller than the power of the first phase; and
    the doping of the walls of the trench is applied through the opening of the etch mask.

2. The method of claim 1, wherein the ion etching comprises successive elementary cycles, each etching a portion of the trench, each cycle comprising:
    a deposition of a passivation layer on the internal walls of the trench portion etched during previous cycles; and
    an anisotropic pulsed plasma ion etching of the trench portion etched during previous cycles; and
    the thickness of the passivation layers deposited during the first phase is smaller than the thickness of the passivation layers deposited during the second phase.

3. The method of claim 2, wherein the plasma ion etching of the elementary cycles is performed in an atmosphere comprising a passivating species, and comprises at least one first etch sequence followed by a second etch sequence with a power smaller than the power of the first etch sequence.

4. The method of claim 1, wherein the ion etching comprises successive elementary cycles, each etching a portion of the trench, each cycle comprising:
    a deposition of a passivation layer on the internal walls of the trench portion etched during previous cycles; and
    an anisotropic pulsed plasma ion etching of the trench portion etched during previous cycles; and
    in that the power of the plasma during the first phase is smaller than the power of the plasma during the second phase.

5. The method of claim 1, wherein the ion etching comprises successive elementary cycles, each etching a portion of the trench, each cycle comprising:
    a deposition of a passivation layer on the internal walls of the trench portion etched during previous cycles; and
    an anisotropic pulsed plasma ion etching of the trench portion etched during previous cycles; and
    in that the time of application of the plasma ion etching of the elementary cycles of the first phase is shorter than the time of application of the plasma ion etching of the elementary cycles of the second phase.

6. The method of claim 1, wherein the ion etching comprises successive elementary cycles, each etching a portion of the trench, each cycle comprising:
    a deposition of a passivation layer on the internal walls of the trench portion etched during previous cycles; and
    an anisotropic pulsed plasma ion etching of the trench portion etched during previous cycles; and
    in that the amount of etch gas used during the first phase is greater than the amount of etch gas used during the second phase.

7. The method of claim 1, wherein the ion etching is a fluorinated plasma ion etching, and in that the fluorine proportion during the first phase is greater than the fluorine proportion during the second phase.

8. The method of claim 1, wherein the ion etching is an ion etching with a plasma based on fluorinated compounds selected from the group comprising $CF_4$, $CH_2F_4$, $C_4F_8$, $C_5F_8$, $C_3F_6$, $SF_6$, $NF_3$.

9. The method of claim 1, wherein the etch mask is made of nitride.

10. The method of claim 1, wherein the trench surrounds an active area of a photodetector, especially CMOS.

11. A method, comprising:
    depositing a mask over a top surface of a substrate including a semiconductor layer, said mask having an opening;
    performing a first etching of the semiconductor layer through the opening in the mask to produce a first etched region, said first etching performed at a first etching power such that the first etched region extends underneath the mask to leave a mask overhang;
    performing a second etching of the semiconductor layer through the opening in the mask to produce a second etched region below the first etched region, said second etching performed at a second etching power less than the first etching power; and
    doping sidewalls of the first and second etched regions through the opening in the mask, the mask overhang limiting a thickness of the doped sidewalls of the first etched region near the top surface of the substrate.

12. The method of claim 11, wherein each of the first and second etching comprises performing successive etch cycles, each etch cycle comprising:
    depositing a passivation layer on the internal walls of a trench portion etched during a previous cycle; and
    anisotropic pulsed plasma ion etching of the trench portion etched during previous cycles.

13. The method of claim 12, wherein a thickness of the passivation layer deposited during the first etching is smaller than the thickness of the passivation layer deposited during the second etching.

14. The method of claim 12, wherein the power of the plasma during the first etching is less than the power of the plasma during the second etching.

15. The method of claim 12, wherein a time of application of the plasma ion etching of the etch cycles of the first etching is shorter than the time of application of the plasma ion etching of the etch cycles of the second etching.

16. The method of claim 12, wherein an amount of etch gas used during the first etching is greater than the amount of etch gas used during the second etching.

17. A method for forming a trench in a semiconductor substrate around an area of a microelectronic element, comprising:
    depositing on said surface of the semiconductor substrate of an etch mask having an opening of access to the substrate around said area;
    performing ion etching through said opening to define said trench; and
    doping the walls of the trench, said doping applied through the opening of the etch mask;
    wherein the ion etching comprises:

a first etching phase to etch the semiconductor substrate to form a first portion of the trench with an etch power set to etch the semiconductor substrate under the etch mask and form a mask overhang; and a second etching phase to etch the semiconductor substrate to form a second portion of the trench, located under the first portion, with an etch power smaller than the power of the first etching phase.

18. The method of claim 17, wherein the ion etching comprises successive elementary cycles, each etching a portion of the trench, each cycle comprising:

a deposition of a passivation layer on the internal walls of the trench portion etched during previous cycles; and an anisotropic pulsed plasma ion etching of the trench portion etched during previous cycles.

19. The method of claim 18, wherein the thickness of the passivation layers deposited during the first phase is smaller than the thickness of the passivation layers deposited during the second phase;

wherein the power of the plasma during the first phase is smaller than the power of the plasma during the second phase; and wherein the time of application of the plasma ion etching of the elementary cycles of the first phase is shorter than the time of application of the plasma ion etching of the elementary cycles of the second phase.

20. The method of claim 17, wherein the ion etching is a fluorinated plasma ion etching, and in that the fluorine proportion during the first phase is greater than the fluorine proportion during the second phase.

\* \* \* \* \*